United States Patent
Behrends et al.

(10) Patent No.: US 7,224,594 B2
(45) Date of Patent: May 29, 2007

(54) GLITCH PROTECT VALID CELL AND METHOD FOR MAINTAINING A DESIRED STATE VALUE

(75) Inventors: Derick G. Behrends, Rochester, MN (US); Chad A. Adams, Rochester, MN (US); Ryan C. Kivimagi, Rochester, MN (US); Anthony G. Aipperspach, Rochester, MN (US); Robert N. Krentler, Austin, TX (US)

(73) Assignee: International Business Machines, Armonk, NY (US)

( * ) Notice: Subject to any disclaimer, the term of this patent is extended or adjusted under 35 U.S.C. 154(b) by 0 days.

(21) Appl. No.: 11/184,346

(22) Filed: Jul. 19, 2005

(65) Prior Publication Data
US 2007/0019454 A1    Jan. 25, 2007

(51) Int. Cl.
*G11C 15/00* (2006.01)
(52) U.S. Cl. .................... 365/49; 365/233; 365/189.11; 711/108
(58) Field of Classification Search ................ 365/49, 365/233, 189.11, 194; 711/108
See application file for complete search history.

(56) References Cited

U.S. PATENT DOCUMENTS

| | | | |
|---|---|---|---|
| 4,879,687 A | 11/1989 | Okamoto et al. | |
| 5,051,948 A | 9/1991 | Watabe et al. | |
| 5,130,947 A | 7/1992 | Reed | |
| 5,373,466 A | 12/1994 | Landeta et al. | |
| 5,598,115 A | 1/1997 | Holst | |
| 5,999,435 A | 12/1999 | Henderson et al. | |
| 6,262,929 B1 | 7/2001 | Miyatake et al. | |
| 6,542,392 B2 | 4/2003 | Yanagawa | |
| 6,552,920 B2 | 4/2003 | Chadwick et al. | |
| 6,711,040 B2 | 3/2004 | Chadwick et al. | |
| 6,781,857 B1 * | 8/2004 | Lien et al. | 365/49 |
| 6,819,579 B1 | 11/2004 | Liu et al. | |
| 6,870,749 B1 | 3/2005 | Park et al. | |
| 2004/0210744 A1 | 10/2004 | Roth et al. | |

* cited by examiner

*Primary Examiner*—David Lam
(74) *Attorney, Agent, or Firm*—The R. Baca Law Firm, PLLC; D'Ann Rifai

(57) ABSTRACT

A glitch protect valid cell and method for maintaining a desired logic state value. The glitch protect valid cell includes a memory element, a state machine, and a glitch protect circuit. The glitch protect circuit includes a propagation delay assembly coupled to a restore assembly. The propagation delay assembly includes a first pull down network coupled to a NOR gate. The restore assembly includes a second pull down network coupled to the propagation delay assembly. Responsive to a glitch signal and timing signal, the first pull down network resets the initial state value of a true valid bit to ultimately enable a pull up network in the NOR gate. Responsive to enablement of the NOR gate pull up network, the second pull down network resets the complement valid bit in the memory element to consequently restore the initial state of the true valid bit.

20 Claims, 8 Drawing Sheets

GLITCH PROTECT VALID CELL AND METHOD FOR MAINTAINING A DESIRED STATE VALUE

BACKGROUND

1. Field of the Invention

The present invention generally relates to a semiconductor memory device. More particularly, but not by way of limitation, the present invention relates to a glitch protect valid cell and method for maintaining a desired state value of a true valid bit in response to a glitch signal and a timing signal.

2. Description of the Related Art

Some common semiconductor memory devices, such as a content addressable memory (CAM) device, typically attach a valid cell at the beginning of a row of integrated data storage units. In effect, valid cells grant access for word data to be stored to and retrieved from a row of data storage units according to the logical state value of a true valid bit stored in a valid cell. Typically, access to entry data is granted if the state value of the true valid bit is "valid", often valued as a logical "1", and denied if the logic state value of the true valid bit is "invalid", often valued as a logical "0".

Illustratively, each word entry in a CAM device features a true valid bit stored in a valid cell. As opposed to other semiconductor devices that first require at least one specific memory address prior to retrieving entry data, CAM semiconductor devices provide high speed data access whereby contents in memory-are accessed through a relatively faster search and match operation scheme. Accordingly, because of their quick and effective search and match capabilities, CAM semiconductor devices with valid cells are often used in high speed switching systems ranging from communication and computer networks to voice and image recognition systems, such as routers, core switches, remote access servers, processor address translation, memory cache hierarchies, and digital-subscriber-line access multiplexers.

Problems may arise, accumulate, and potentially compound if one or many signals for invalidating a true valid bit arrive too late after a typical high speed compare and match operation between the valid cell and CAM array. Unfortunately, there exists no known device that adequately compensates for time delayed invalidate functions, hereinafter referred to as a "glitch signal(s)", with respect to a true valid bit within a valid cell. In this disclosure and appended claims the term "glitch signal" refers to a signal variance typically in the form of a brief pulse which could possibly trigger a logic state change of a true valid bit. Typically, a signal variance results from a time delay in a combinational logic circuit from the point in time that input signals are applied until their effect propagates through the various components of the combinational logic circuit and resulting outputs react to the inputs.

Therefore, a need exists for a device that is responsive to at least one glitch signal. In particular, there exists a need for a device that restores an initial valid state value of a true valid bit after being subjected to at least one glitch signal. Moreover, there exists a need for a device that maintains an initial invalidate state value of a true valid bit after being subjected to at least one glitch signal. Many other problems and disadvantages of the prior art will become apparent to one skilled in the art after comparing such prior art with the present invention as herein described.

SUMMARY

A glitch protect valid cell and method for maintaining a desired logic state value of a true valid bit in response to an external glitch signal and timing signal. The glitch protect valid cell may be integrated with a content addressable memory (CAM) array for indicating whether word data stored within the CAM is valid. In one aspect, in a glitch protect condition, the glitch protect valid cell restores the initial state value of the true valid bit despite at least one glitch signal invalidating the initial state value.

In one aspect, the glitch protect valid cell includes a memory element, a state machine, and a glitch protect circuit each responsive to one another. The memory element is electrically coupled to differential bit lines and stores an initial state value of the true valid bit therefrom. The state machine stores a previous logical state value of the true valid bit from the memory element. The glitch protect circuit includes a propagation delay assembly and a restore assembly electrically coupled to one another. The propagation delay assembly includes a first pull down network and a NOR gate electrically coupled to one another. The restore assembly includes a second pull down network electrically coupled to the propagation delay assembly and the memory element. The first pull down network is responsive to the glitch signal and the timing signal to selectively engage the NOR gate. In a glitch protect condition, the first pull down network resets the initial state value of the true valid bit according to the timing signal and the glitch signal supplied to the glitch protect circuit. The initial state value of a true valid bit is restored in the memory element with the second pull down network via the timing signal and a restore signal provided by an enabled pull up network within the NOR gate. Specifically, the second pull down network is responsive to the pull up network selectively enabled within the NOR gate and resets the complement valid bit in the memory element to consequently restore the initial state value of the true valid bit.

In one aspect, in an invalidate condition, the glitch protect valid cell maintains the initial state invalidate value of the true valid bit. Specifically, the state machine sets the initial invalidate value. The set initial invalidate value disables the pull up network within the NOR gate as the NOR gate generates a restore signal that prevents the second pull down network from resetting the complement valid bit in the memory element.

In one aspect, a memory system features a memory block array responsive to a glitch protect valid cell. Similarly, the glitch protect valid cell includes a memory element, a state machine, and a glitch protect circuit electrically coupled to one another. Operatively, the glitch protect circuit of the memory system assists in maintaining a desired logic state value in response to a glitch signal and a timing signal.

In one aspect, a computer-implemented method for maintaining a desired logic state value in response to a glitch signal and a timing signal includes coupling a CAM array as responsive to a glitch protect valid cell. Accordingly, a true valid bit is received from the differential bit lines via a memory element provided by the glitch protect valid cell. The initial state values of the true valid bit and the complement valid bit are stored in the memory element. Thereafter, a previous state value of the true valid bit from the memory element is stored in a state machine provided by the glitch protect valid cell. In a glitch protect condition, the glitch protect circuit resets the initial value of the true valid bit according to the glitch signal and the timing signal supplied to the glitch protect circuit. The initial state value of the true valid bit is restored with a NOR gate of the glitch protect circuit. In particular, the initial value of the true valid bit is restored via the timing signal and a restore signal provided by an enabled pull up network within the NOR gate. Other aspects, advantages, and novel features of the present invention will become apparent from the detailed description of the present invention when considered in conjunction with the accompanying drawings.

BRIEF DESCRIPTION OF THE DRAWINGS

The present invention is illustrated by way of example and not by limitation in the accompanying figures, in which like references indicate similar elements, and in which.

Skilled artisans appreciate that elements in the Figures are illustrated for simplicity and clarity and have not necessarily been drawn to scale. For example, the dimensions of some of the elements in the Figures may be exaggerated relative to the other elements to help improve understanding of the embodiments of the present invention.

DETAILED DESCRIPTION

For a more complete understanding of the present invention, preferred embodiments of the present invention are illustrated in the Figures. Like numerals being used to refer to like and corresponding-parts of the various accompanying drawings. It is to be understood that the disclosed embodiments are merely exemplary of the invention, which may be embodied in various forms.

Figure 1:
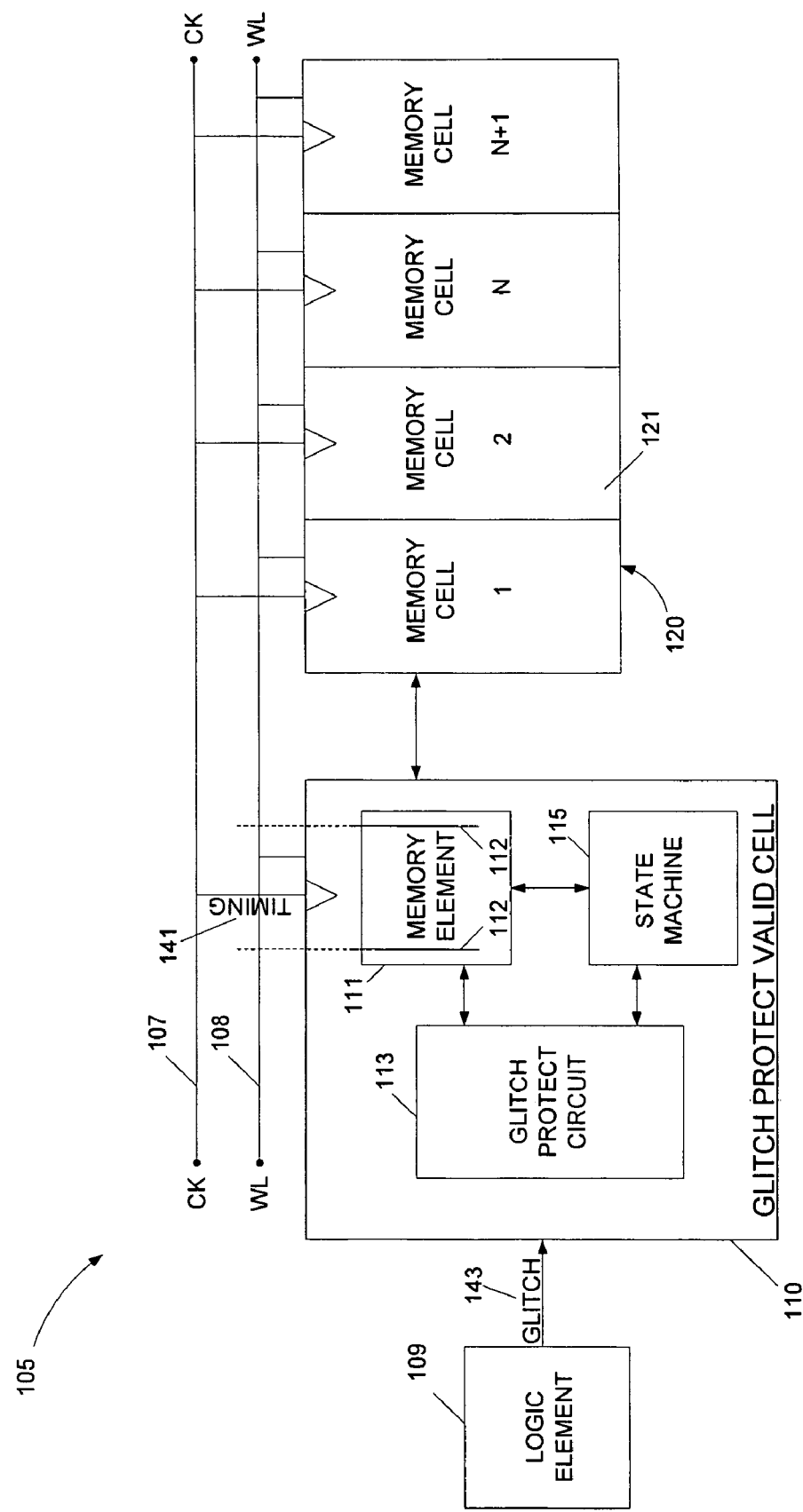
FIG. 1 is a block diagram illustrating a memory system for maintaining a desired state value in response to a glitch signal and a timing signal according to the present invention, the memory system featuring a glitch protect valid cell electrically coupled to a memory block array, the glitch protect valid cell restores the initial state value of the true valid bit despite at least one glitch signal invalidating the initial state value.

FIG. 1 illustrates one aspect, among others, of a memory system 105 responsive to a glitch signal 143 and a timing signal 141. As shown in FIG. 1, the memory system 105 includes a glitch protect valid cell 110 and a memory block array 120 responsive to the glitch protect valid cell 110. Generally, with the glitch protect valid cell 110, the memory system 105 maintains a desired logic state value in response to the glitch signal 143 provided by a logic element 109 electrically coupled to the glitch protect valid cell 110 and the timing signal 141 supplied by a clockline 107 electrically coupled to the glitch protect valid cell 110. In one exemplary embodiment, the logic element 109 is a type well known in the industry such as, among others, a NAND gate, a NOR gate, an inverter, a multiplexer, a decoder, a read-only memory, a programmable logic array, a programmable logic device, a flip-flop, a combinational logic network, a counter or other sequential network, a clocked sequential network, and a combination thereof. The logic element 109 is responsive to a timing signal either combinationally or sequentially and, ultimately, provides a glitch signal having an invalidate function for invalidating a true valid bit from the glitch protect valid cell 110. In one exemplary embodiment, the logic element 109 includes a single logic gate such as a NAND and NOR gate. In one exemplary embodiment, the logic element 109 includes a plurality of logic gates of a type well known in the industry such as a logic element shown in FIG. 5.

Illustratively, the memory block array 120 may be a conventional content addressable memory (CAM) array, such as a sum-addressed CAM architecture, responsive to the glitch protect valid cell 110. As discussed below, FIG. 3 specifically shows one embodiment of a CAM array responsive to a glitch protect valid cell.

In operation, referring to FIG. 1, the glitch protect valid cell 110 grants access for word data to be stored and retrieved from a memory cell 121 of the memory block array 120. In one exemplary embodiment, access to word data is regulated by the value of the true valid bit stored on a true memory line the complement valid bit stored on a complement memory line. Accordingly, in one exemplary embodiment, access to the word data in the memory block array 120 is granted with a "valid" true valid bit, i.e. valued as "high" or a logical "1", or denied with an "invalid" true valid bit, valued as "low" or a logical "0". It should be added that in one exemplary embodiment, a glitch protect valid cell stores a plurality of true valid bits per word. Moreover, those of ordinary skill in the art will readily recognize that a true valid bit may refer to other states of data in addition to validity, such as age.

Specifically, the glitch protect valid cell 110 includes a glitch protect circuit 113. The glitch protect circuit 113 reliably restores the initial logical state value of a true valid bit despite receiving at least one glitch signal due to inherent propagation delay. characteristics associated with the logic element 109.

The memory block array 120 includes a plurality of integrated memory cells 121 for storing entry data therein. As shown in FIG. 1, the memory block array 120 in one exemplary embodiment forms a row of memory cells 121 for collectively storing word data. Moreover, a word line 108 is electrically coupled to each memory cell 121 for operatively reading or writing entry data to the memory block array 120.

In one exemplary embodiment, the memory block array 120 defines a matrix of memory cells according to rows and columns. Inasmuch, the glitch protect valid cell 110 is engaged at the beginning of each row of the memory block array 120 so as to control access to the word data provided along that particular row of the memory block array 120. In alternative embodiments, either a single glitch protect valid cell or networked glitch protect valid cells provide access to entry data stored within a memory block array having a matrix of rows and columns.

The glitch protect valid cell 110 includes a memory element 111. The memory element 111 is electrically coupled to externally provided differential bit lines 112. Those of ordinary skill in the art will readily recognize standard means for coupling the differential bit lines 112 to the memory element 111, such as differential bit line ports. The bit lines 112 include a true bit line for providing a true valid bit and a complement bit line for providing a complement valid bit. Particularly, in one exemplary embodiment, the logic state value of the complement valid bit is equal to the inverted logic state value of the true valid bit.

Operatively, in one exemplary embodiment, the memory element 111 stores an initial logic state value of the true valid bit from the bit lines 112. Those of ordinary skill in the art will recognize that the memory element 111 requires receiving and storing at least one external input from the bit lines 112, such as either a true valid bit or a complement valid bit. As such, because it is the inverse of the true valid bit, the logic state value of a complement valid bit may be either obtained directly from a complement bit line or, alternatively, provided by a regenerative feedback loop from the memory element 111 based on a true valid bit logic state value input.

The glitch protect valid cell 110 includes a state machine 115. The state machine 115 is responsive to the memory element 111. Operatively, the state machine 115 stores a previous logic state value of the true valid bit from the memory element 111. Moreover, in one exemplary embodiment, the state machine 115 creates a complement value for the previous logic state value of the true valid bit for storage therein. In this disclosure and appended claims the term "previous" refers to during the last clock cycle. Alternatively, in one exemplary embodiment, the state machine 115 stores a plurality of logic state values in addition to the value of the last clock cycle.

As previously mentioned, the glitch protect valid cell 110 of FIG. 1 includes the glitch protect circuit 113. The glitch protect circuit 113 is electrically coupled to the memory element 111 and the state machine 115. Moreover, the glitch protect circuit 113 receives one glitch signal during a single clock cycle from the logic element 109. In one exemplary embodiment, the glitch protect circuit 113 receives a plurality of glitch signals, either independent or gated, in one clock cycle.

As discussed in greater detail below, the glitch protect circuit 113 features a NOR gate electrically coupled between two opposing pull down networks. Accordingly, the glitch protect circuit 113 responds to gated delayed invalidate functions characterized by at least one glitch signal. In one exemplary embodiment, in a glitch protect condition, the initial valid logic state value of the true valid bit is restored, or in an invalidate condition, the initial invalid logic state value of the true valid bit is maintained. In effect, the glitch protect circuit 113 maintains the validity of a true valid bit within the memory element 111 despite an improper invalidation of the true valid bit due to propagation delay from the logic element as indicated by at least one glitch signal or ensures the invalidity of a true valid bit despite propagation delay in the glitch signal 143.

It must be said that in this disclosure and appended claims, a NOR gate is one exemplary embodiment of a glitch and timing signal dependent logic gate. Accordingly, those of ordinary skill in the art will readily recognize that the glitch and timing signal dependent logic gate comprises any suitable logic gate or combination of logic gates having at least one pull up network including at least one pull up device; and whereby the suitable logic gate or combination of logic gates is of a type well known in the industry for maintaining a desired logic state value of a true valid bit in response to at least one glitch and timing signal.

Figure 2:
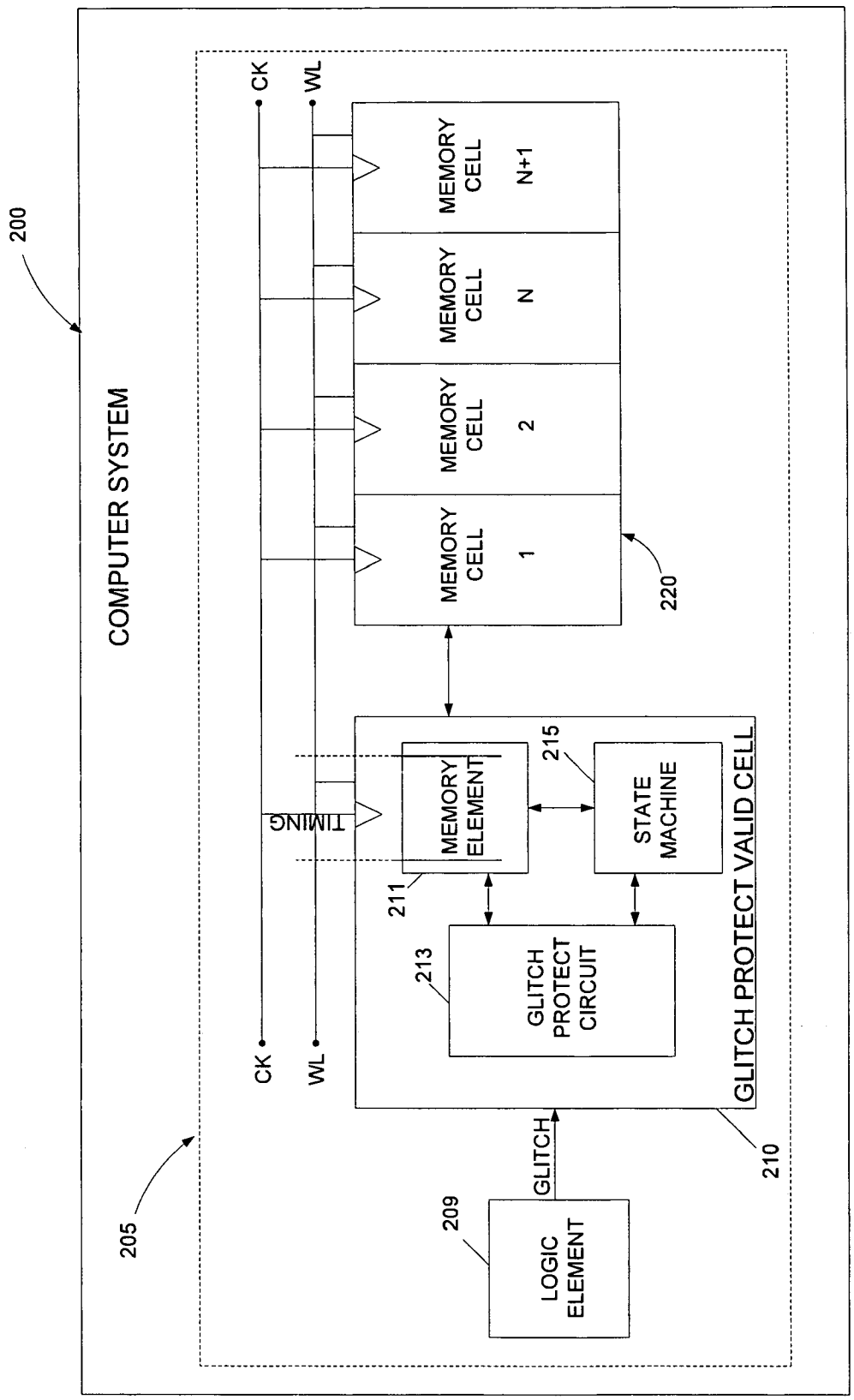
FIG. 2 is a block diagram illustrating one exemplary embodiment of a memory system integrated with a computer system, the memory system for maintaining a desired state value in response to a glitch signal and a timing signal, the memory system featuring a glitch protect valid cell electrically coupled to a memory block array, the glitch protect valid cell restores the initial state value of the true valid bit despite at least one glitch signal invalidating the initial state value.

FIG. 2 is a block diagram illustrating one aspect, among others, of a computer system 200 featuring a memory system 205. During operation of the computer system 200, the memory system 205 maintains a desired logic state value in response to a glitch signal received from a logic element 209 and a timing signal. The memory system 205 is similar is similar to the memory system 105 of FIG. 1. In particular, the memory system 205 includes a glitch protect valid cell 210 electrically coupled to a memory block array 220. The glitch protect valid cell 210 includes a memory element 211, a glitch protect circuit 213, and a state machine 215, each electrically coupled to one another. During operation of the computer system 200, the glitch protect valid cell 210 stores a true valid bit and is responsive to at least one external glitch and timing signal. Operatively, in one exemplary embodiment, the glitch protect valid cell 210 restores the initial state logic value of the true valid bit despite at least one glitch signal invalidating the initial state logic value.

Figure 3:
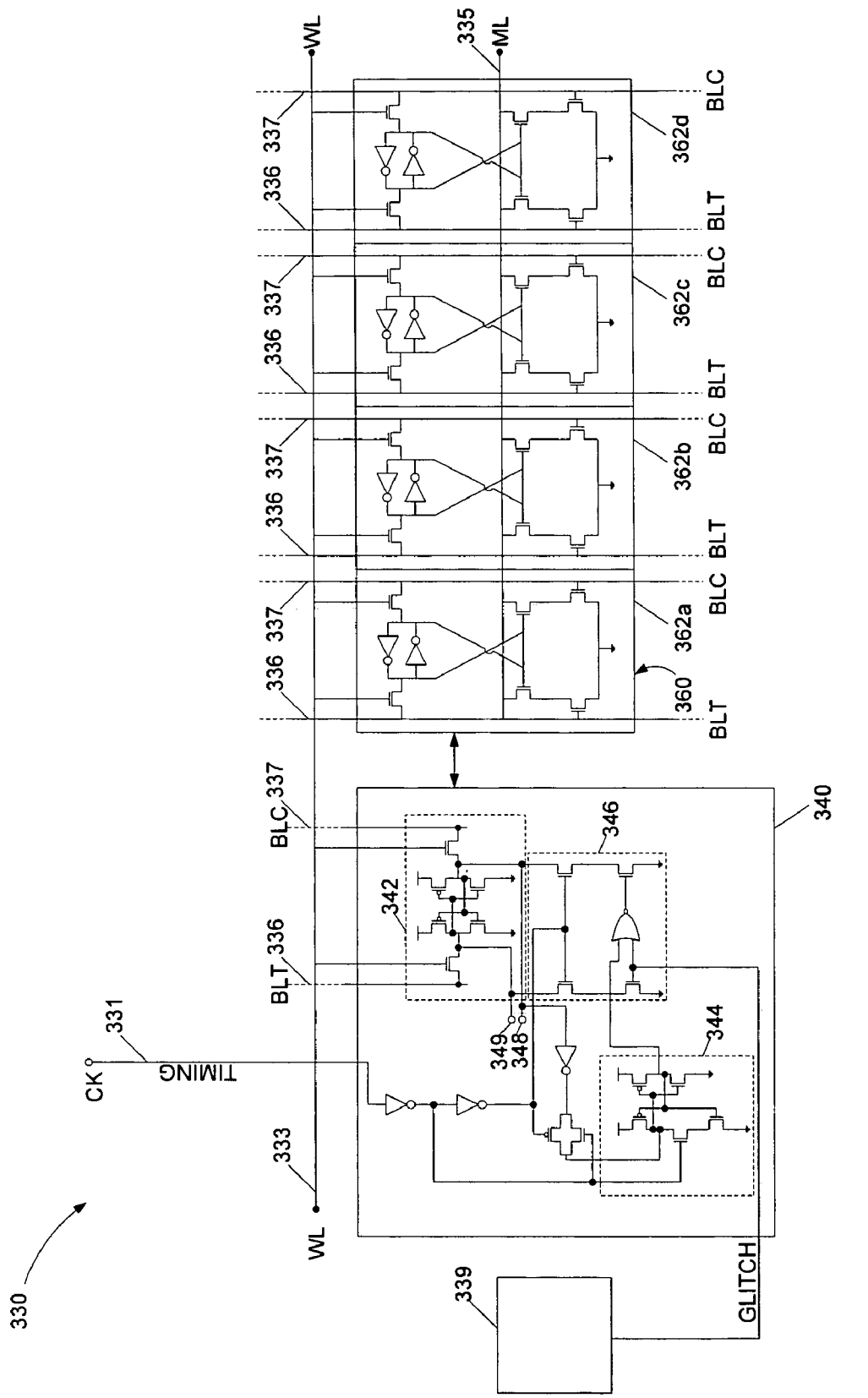
FIG. 3 is a schematic circuit diagram illustrating one exemplary embodiment of a memory system featuring a content addressable memory (CAM) array responsive to glitch protect valid cell.

FIG. 3 is a schematic circuit diagram illustrating one aspect, among others, of a memory system 330. Operatively, the memory system 330 maintains a desired logic state value in response to a glitch signal provided by a logic element 339. The memory system 330 includes a glitch protect valid cell 340 and a content addressable memory (CAM) array 360 responsive to the glitch protect valid cell 340.

The CAM array 360 includes a plurality of CAM cells 362a, 362b, 362c, and 362d, such as sum-addressed CAM cells. In one exemplary embodiment, as shown in FIG. 3, the CAM array 360 forms a row for collectively storing word data. Accordingly, each CAM cell 362a–d is coupled to a word line 333. Moreover, a match line 335 is electrically coupled to each CAM cell 362a–d. Desired entry data stored in a particular CAM cell is retrieved through standard CAM operations of a type well known in the industry according to search and matching procedures facilitated, in part, by the match line 335. As shown in FIG. 3, each CAM cell 362a–d is electrically coupled to differential bit lines including a true bit line 336 and a complement bit line 337 for providing a true data bit and complement data bit, respectively.

The glitch protect valid cell 340 of FIG. 3 is electrically coupled to the logic element 339 that provides the glitch signal and to a clockline 331 for providing the timing signal to the glitch protect valid cell 340. The glitch protect valid cell 340 includes a memory element 342. The memory element 342 is electrically coupled to the true bit line 336 and the complement bit line 337. In operation, the memory element 342 stores an initial logic state value, e.g. a logical "1", of the true valid bit and the complement valid bit, e.g. a logical "0". In one exemplary embodiment, as illustrated in FIG. 3, the memory element 342 comprises a static random access memory (SRAM) cell. Those of ordinary skill in the art will readily recognize other well known semiconductor devices for use as the memory element 342.

The glitch protect valid cell 340 includes a state machine 344. The state machine 344 is responsive to the memory element 342. Operatively, in one exemplary embodiment, the state machine 344 stores the previous logic state value of the true valid bit from the memory element 342.

The glitch protect valid cell 340 includes a glitch protect circuit 346. The glitch protect circuit 346 is electrically coupled to the memory element 342 and the state machine 344. Referring to FIG. 3, the glitch protect circuit 346 includes a NOR gate and a pair of pull down networks electrically positioned on either side of the NOR gate. Generally, based on a glitch signal and a timing signal, the first pull down network transitionally invalidates a valid true valid bit, i.e. assigning a logical "0" to an initially logical "1" value, to ultimately enable a pull up network (not shown) within the NOR gate. Consequently, the NOR gate transmits a restore signal to the second pull down network (described in more detail in FIG. 4).

Based on the timing signal and the restore signal, the second pull down network resets the complement valid bit stored in the memory element 342 and, thus, ultimately restores the initial logical state value of the true valid bit. It should also be said that the state machine 344 provides to the NOR gate a complement value of the previous logic value of the true valid bit from the memory element 342.

Accordingly, the glitch protect circuit 346 gates at least one or a combination of many glitch signals based on the setup and hold to the falling edge of the clock. In other words, a glitch protect circuit compensates for time delayed invalidate functions with respect to a true valid bit within a glitch protect valid cell.

Figure 4:
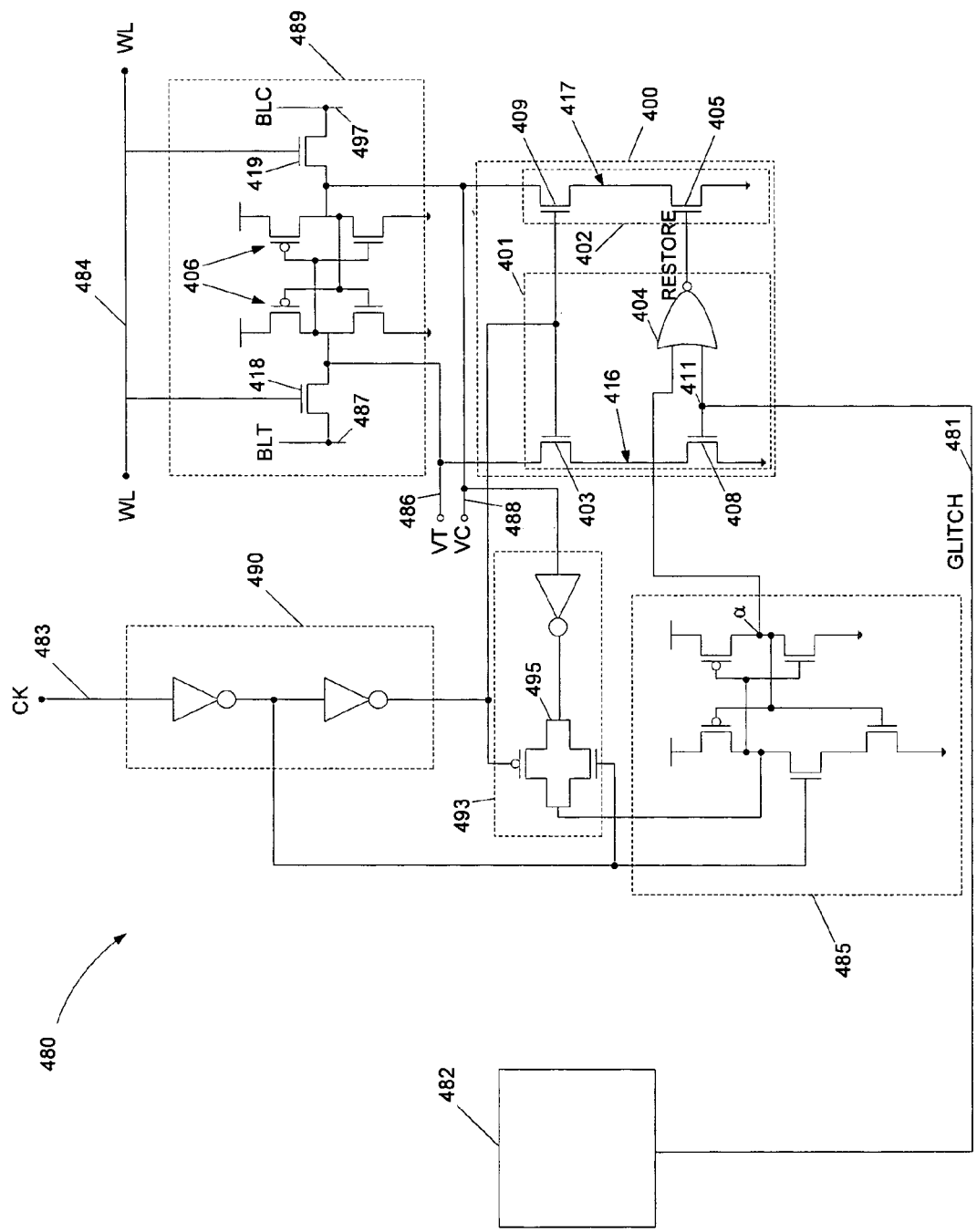
FIG. 4 is a circuit diagram of one exemplary embodiment of a glitch protect valid cell for maintaining a desired state value in response to a glitch signal and a timing signal.

FIG. 4 is a circuit diagram illustrating one aspect, among others, of a glitch protect valid cell 480. In operation, the glitch protect valid cell 480 maintains a desired logic state value in response to a glitch signal and a timing signal. The glitch protect valid cell 480 is electrically coupled to a memory block array (not shown), such as a content addressable memory (CAM) array.

The glitch protect valid cell 480 in FIG. 4 is electrically coupled to a true bit line (BLT) 487 and a complement bit line (BLC) 497 for respectively supplying a true valid bit and its complement. The glitch protect valid cell 480 is electrically coupled to a logic element 482 for providing the glitch signal and to a clockline 483 for providing the timing signal to the glitch protect valid cell 480.

The glitch protect valid cell 480 includes a memory element 489. As shown in FIG. 4, the memory element 489 is electrically coupled to a true bit line 487 and the complement bit line 497. The memory element 489 stores an initial logic state value of the true valid bit on the true memory line 486. Accordingly, based on its cross-coupled inverter configuration, the memory element 489 operatively establishes a regenerative loop for facilitating storage of a true valid bit on the true memory line 486 and a complement valid memory line 488. In one exemplary embodiment, with the regenerative feedback loop established by its cross-coupled inverter configuration, the memory element 489 generates a logic state value of a complement valid bit based on a true valid bit logic state output. It should be added that, as shown in FIG. 4, a true memory line 486 and a complement memory line 488 each electrically coupled to the memory element 489 so as to provide the values of the true valid bit, Vt, and the complement valid bit, Vc, to various other components throughout the glitch protect valid cell 480.

In one exemplary embodiment, the memory element 489 includes a static random access memory (SRAM) semiconductor device. Specifically, the memory element 489 features two cross-coupled CMOS inverters 406, with each inverter featuring a NMOSFET (n-channel metal-oxide-semiconductor field effect transistor device) and a PMOSFET (p-channel metal-oxide-semiconductor field effect transistor device).

Operatively, the memory element 489 is electrically coupled to a word line 484. In particular, the word line 484 is operatively coupled by a NMOS transistor 418 between the true bit line 487 and the first cross-coupled network and, similarly, by another NMOS transistor 419 between the complement bit line 497 and the second cross-coupled network. As such, the word line 484 selectively enables either reading or writing to the memory element 489 when the NMOS gates are logically "high" whereas the true bit line 487 and the complement bit line 497 provide logic values of the true valid bit and the complement valid bit to the memory element 489, respectively, that remain stored in the memory element 489 when the NMOS gates are logically "low".

The glitch protect valid cell 480 further includes a state machine interface 493. The state machine interface 493 is electrically coupled to the memory element 489. The state machine interface 493 receives a timing signal. It should be added that in this disclosure and appended claims the term "timing signal" includes a plurality of phase shifted clock signals formed within a glitch protect valid cell in addition to an initial external timing signal input received by a glitch protect valid cell from a clockline.

Moreover, the state machine interface 493 facilitates transfer of the initial state logic value from the memory element 489 to the state machine 485 based on the timing signal. In particular, as shown in FIG. 4, the state machine interface 493 includes a transmission gate 495. In one exemplary embodiment, the transmission gate 495 comprises a CMOS transmission gate. The state machine interface 493 electrically coupled to the complement memory line 488 for receiving the complement value of the true valid bit. An inverter is electrically coupled between the complement memory line 488 and the transmission gate 495 so as to provide an inverted logical value of the complement valid bit to the transmission gate 495, and subsequent transfer of the inverted logical value through the transmission gate 495 is based on a timing signal.

The glitch protect valid cell 480 includes a state machine 485. The state machine 485 is responsive to the memory element 489. The state machine 485 stores a previous logical state value of the true valid bit from the memory element 489. In one exemplary embodiment, as shown in FIG. 4, the state machine 485 includes two cross-coupled transistor networks, with each network featuring a PMOS and a NMOS transistor. Moreover, an additional NMOS transistor is electrically coupled to the first transistor network that is responsive to an inverted timing signal provided by the clockline 483. Inasmuch, the state machine 485 is activated while the clock is "low" such that a previous state value of the true valid bit from the memory element 489 is stored therein.

Illustratively, in operation while the clock is "high", the memory element 489 receives and stores the current logic state value of a true valid bit. Additionally, the state machine interface 493 blocks transfer of the current state logic value from the memory element 489 to the state machine 485; and the state machine 485 maintains storage of a previous logic state value of the true valid bit from the memory element 489. Alternatively, in operation while the clock is "low", the memory element 489 maintains storage of the current logic state value of the true valid bit. Moreover, the state machine interface 493 transfers the current state logic value from the memory element 489 to the state machine 485. Based on the current logic value of the memory element 489 transferred by the state machine interface 493, the state machine 485 receives and stores the previous logic state value of the true valid bit from the memory element 489 via the state machine interface 493.

The glitch protect valid cell 480 further includes a glitch protect circuit 400. The glitch protect circuit 400 is electrically coupled to the memory element 489 and the state machine 485. In one exemplary embodiment, as shown in FIG. 4, the glitch protect circuit 400 includes a propagation delay assembly 401 and a restore assembly 402 electrically coupled to the propagation delay assembly 401. In particular, the propagation delay assembly 401 includes a NOR gate 404 and a first pull down network 416 electrically coupled to the NOR gate 404 and the memory element 489. Similarly, the restore assembly 402 includes a second pull down network 417. The second pull down network 417 is electrically coupled to the propagation delay assembly 401 and the memory element 489.

The first pull down network 416 in one exemplary embodiment includes a pair of transistors 403, 408. In one exemplary embodiment, the pair of transistors 403, 408 each comprise a NMOS transistor. A first transistor 403 of the first pull down network 416 is electrically coupled to the true memory line 486 and is responsive to a timing signal from the clockline 483. A second transistor 408 of the first pull down network 416 is grounded at one end, coupled to the first transistor 403 at another end, and is responsive to a glitch signal provided by a logic line 481 coupled thereto.

Similarly, the second pull down network 417 includes a reset gate 405 and a time select gate 409. In one exemplary embodiment, the reset gate 405 and the time select gate 409 each comprise a NMOS transistor. The reset gate 405 is grounded at one end and electrically coupled to the time select gate 409 at another end. The reset gate 405 is responsive to a restore signal provided by the NOR gate 404 coupled thereto. The time select gate 409 is electrically coupled to the reset gate 405 at one end and is electrically coupled to the complement memory line 488 at another end.

In operation, the second pull down network 417 is responsive to a pull up network (not shown) that is selectively enabled within the NOR gate 404. Accordingly, the second pull down network 417 resets the complement valid bit within the memory element 489 along the complement memory line 488 via a timing signal and a restore signal respectively provided by the clockline 483 and the enabled NOR gate 404. In effect, as discussed in detail below, the timing signal and restore signal selectively permit the second pull down network 417 to restore the initial logic state value of the true valid bit in the memory element 489 in a glitch protect condition. It should be added that, as shown in FIG. 4, the parallel connection of the first transistor 403 and the time select gate 409 is further connected in series with respect to the second transistor 408, the NOR gate 404, and the reset gate 405.

Generally, the conditions associated with the timing signal and restore signal for permitting the NOR gate 404 to restore the initial logic state value of the true valid bit facilitates a desired control based on the set up and hold to the falling edge of the clock. Illustratively, in a glitch protect condition for maintaining a desired logic state value of a true valid bit despite propagation delay occurrences embodied within a least one glitch signal, the first pull down network 416 of the propagation delay assembly 401 resets the initial state value of the true valid bit according to a timing signal and a glitch signal. The state machine 485 and the first pull down network 416 provide to the NOR gate 404 a previous state value of the true valid bit, specifically a complement value of the previous state value, and a logical "0" value, respectively. The second pull down network 417 is responsive to a pull up network selectively enabled within the NOR gate 404. As such, the second pull down network 417 resets the complement valid bit in the memory element 489 via the timing signal and a restore signal provided by the enabled pull up network within the NOR gate 404. Thus, the glitch protect circuit 400 restores the initial state value of the true valid bit in the glitch protect condition.

Alternatively, in an invalidate condition, the glitch protect circuit 400 maintains the initial state invalidate value of the true valid bit within the memory element 489. In other words, the glitch protect circuit 400 does not reset an invalidated true valid bit because of an invalidating condition(s) that is often indicative of an error. Inasmuch, the initial state invalidate value is set within the state machine 485 prior to ultimate transmission to the NOR gate 404. The set initial state invalidate value disables the pull up network within the NOR gate 404 as the NOR gate 404 provides a restore signal that prevents the second pull down network 417 from resetting the complement valid bit of the memory element 489 at the complement memory line 488. Ultimately, in the invalidate condition, the glitch protect circuit 400 of the glitch protect valid cell 480 restricts access to entry data associated with the memory block array electrically coupled to the glitch protect valid cell 480 based on a glitch signal and a timing signal.

The glitch protect valid cell 480 further includes a clock interface assembly 490. The clock interface assembly 490 is electrically coupled to the state machine interface 493, the state machine 485, the glitch protect circuit 400, and the clockline 483 for receiving a timing signal. The clock interface assembly 490, in one exemplary embodiment, renders a plurality of timing signals for the state machine interface 493, the state machine 485, and the glitch protect circuit 400. Illustratively, the clock interface assembly 490 permits the transfer of the state value of the true valid bit from the memory element 489 to the state machine 485, thereby storing the previous state value within the state machine 485 for each instance when the timing signal is valued as "low" or a logical "0". In a further illustration, by synchronously engaging both the first transistor 403 and the time select gate 409, the clock interface assembly 490 in one exemplary embodiment selectively transfers values of the true valid bit and complement valid bit between the NOR gate 404 and the memory element 489. A detailed accounting of the operation of the glitch protect valid cell 480 of FIG. 4 is provided in greater detail below.

Figure 5:
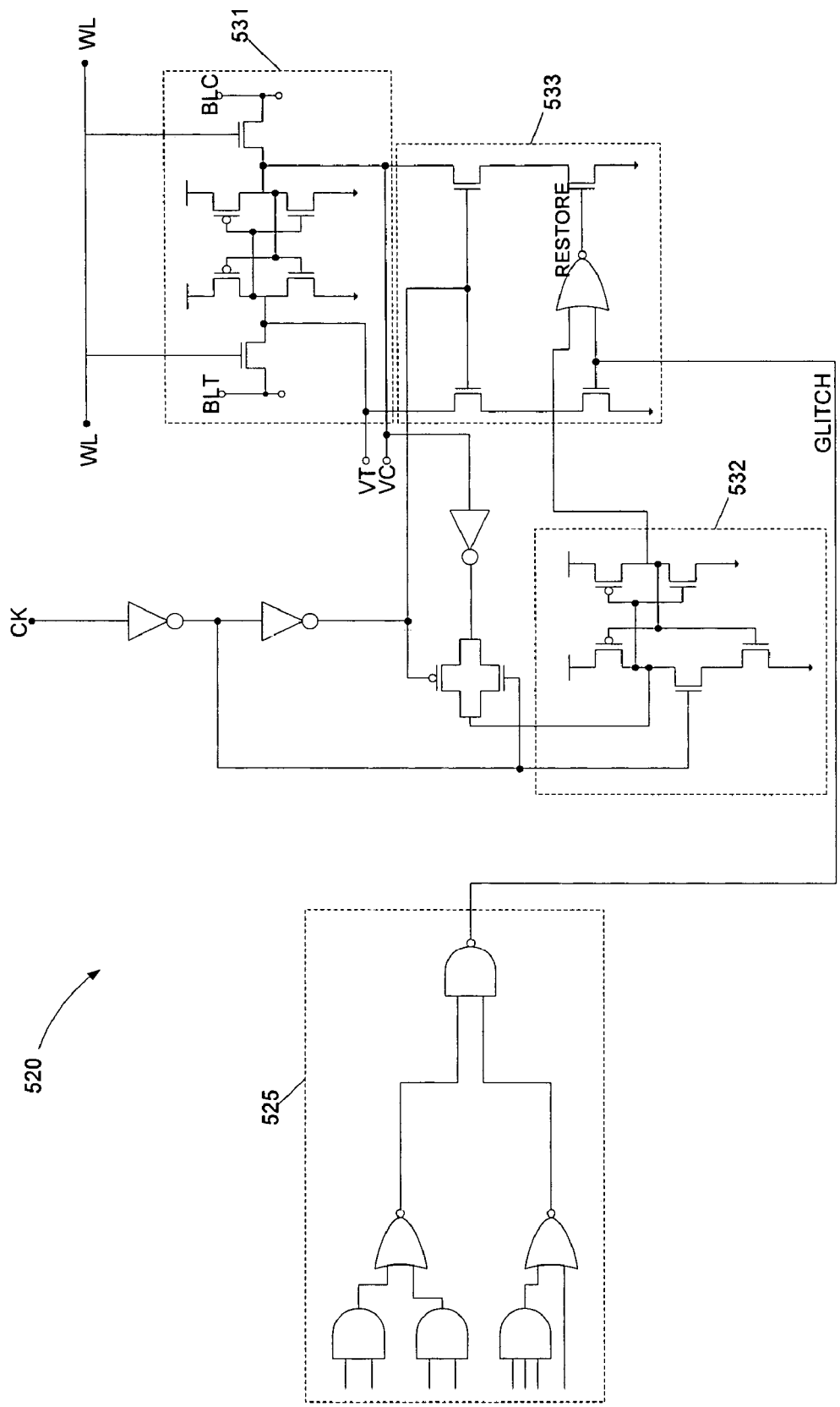
FIG. 5 is circuit diagram illustrating one exemplary embodiment of a glitch protect valid cell responsive to a timing signal and a glitch signal provided by a logic element, the logic element comprising a combinational logic cell.

Similarly, FIG. 5 illustrates one aspect, among others, of a glitch protect valid cell 520 for a sum-addressed CAM array. In one exemplary embodiment, the glitch protect valid cell 520 features a memory element 531, a state machine 532, and a glitch protect circuit 533, each similar to their respective components of the glitch protect valid cell 480 of FIG. 4. As shown in FIG. 5, a logic element 525 is electrically coupled to the glitch protect valid cell 520. In one exemplary embodiment, the logic element 525 comprises a combinational logic cell for supplying a glitch signal to the glitch protect circuit 533.

FIG. 5 illustrates one exemplary computer-implemented method for maintaining 30 a desired logic state value in response to a glitch signal and a timing signal. At least one glitch signal is applied to the glitch protect valid cell 520 during a clock cycle. In one exemplary embodiment, a plurality of glitch signals are applied to the glitch protect valid cell 520 during a clock cycle.

A content addressable memory (CAM) array (not shown) is coupled to the glitch protect valid cell 520. In other exemplary embodiments, the glitch protect valid cell 520 is coupled to a memory block array of a type well known in the industry. The memory element 531 receives a logic value of the true valid bit from the differential bit lines and stores an initial logic state value of the true valid bit. Based on a timing signal, a previous logic state value of the true valid bit is stored from the memory element 531 to the state machine 532.

In a glitch protect condition, the initial logic state value of the true valid bit is reset by the glitch protect circuit 533 according to the glitch signal and the timing signal. Resetting of the initial state value is accomplished with a NOR gate and a first pull down network electrically coupled to the NOR gate, each provided by the glitch protect circuit 533. The initial state value of the true valid bit is restored with the glitch protect circuit via the timing signal and a restore signal provided by an enabled pull up network (not shown) within the NOR gate. A restore signal is generated by selectively enabling the pull up network in the NOR gate. In particular, the complement value of the previous logical state of the true valid bit and a logical "0" value are provided to the NOR gate by the state machine 532 and the first pull down network of the glitch protect circuit 533, respectively. The complement valid bit within the memory element 531 is reset by applying the restore signal to a second pull down network provided by the glitch protect circuit 533, thus restoring the initial state value of the true valid bit.

FIG. 5 further illustrates a computer-implemented method for maintaining an initial logic state invalidate value of the true valid bit in the memory element 531 with the glitch protect circuit 533 in an invalidate condition. The state machine 532 sets the initial logic state value prior to transmission to the NOR gate of the glitch protect circuit 533. In particular, within the state machine 532, the previous state is stored as a logical "0" value whereas the complement of the previous state is stored as a logical "1" value of which is directed as a set input value to the NOR gate. The set initial logic state value from the state machine 532 disables the pull up network within the NOR gate regardless of the logic state value provided by the glitch signal input into the NOR gate. As a result, a restore signal is provided from the NOR gate for preventing the second pull down network of the glitch protect circuit 533 from resetting the complement valid bit in the memory element 531, thereby maintaining the initial state invalidate value of the true valid bit. Maintaining an initial logic state invalidate value within the glitch protect valid cell 520 ensures that data associated with the CAM array electrically coupled to the glitch protect valid cell 520 is invalidated and, thus, not accessed.

Figure 6:
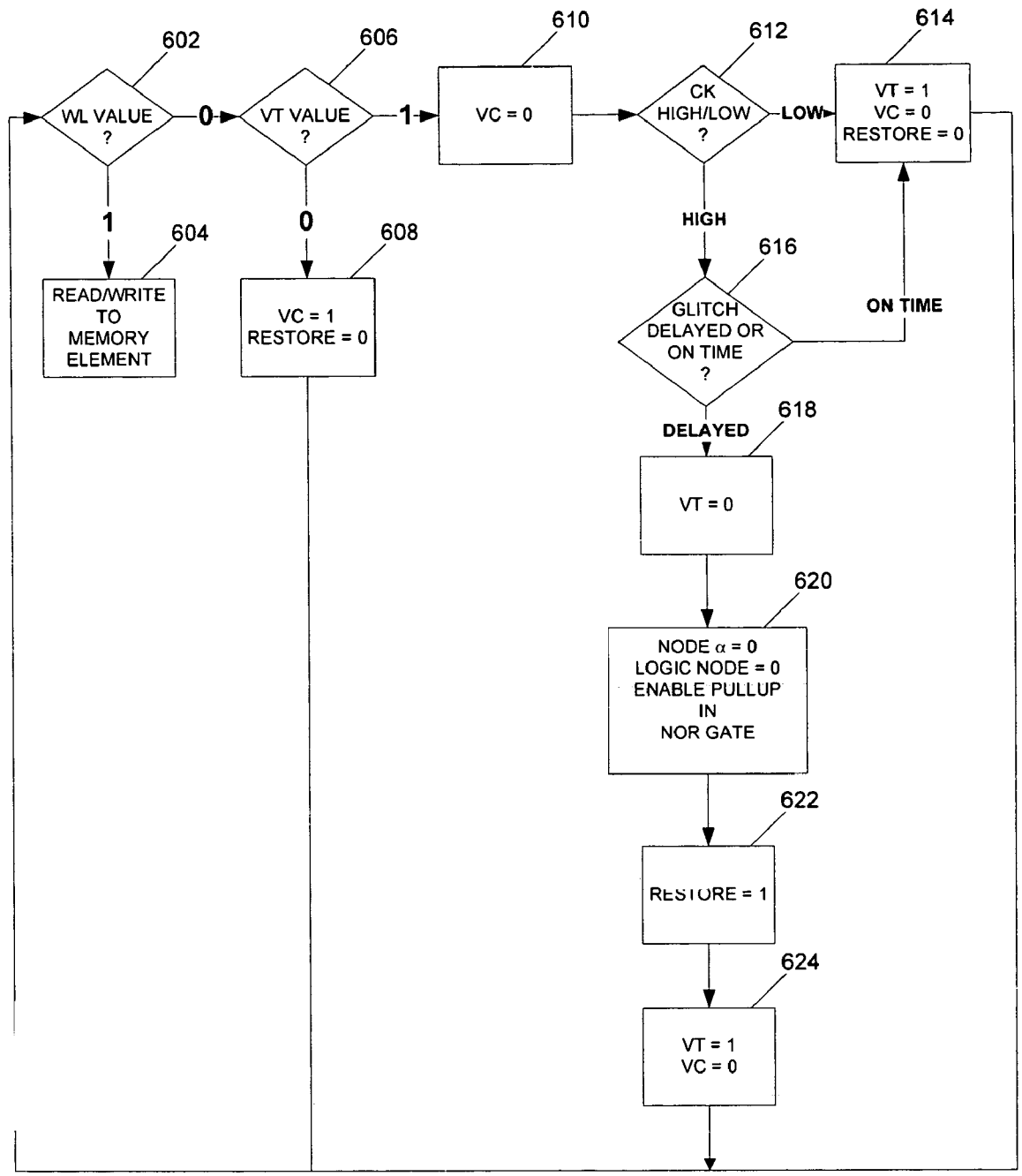
FIG. 6 is a flow chart demonstrating exemplary operations of the glitch protect valid cell of FIG. 4 including a glitch protect condition and an invalidate condition.
Figure 7:
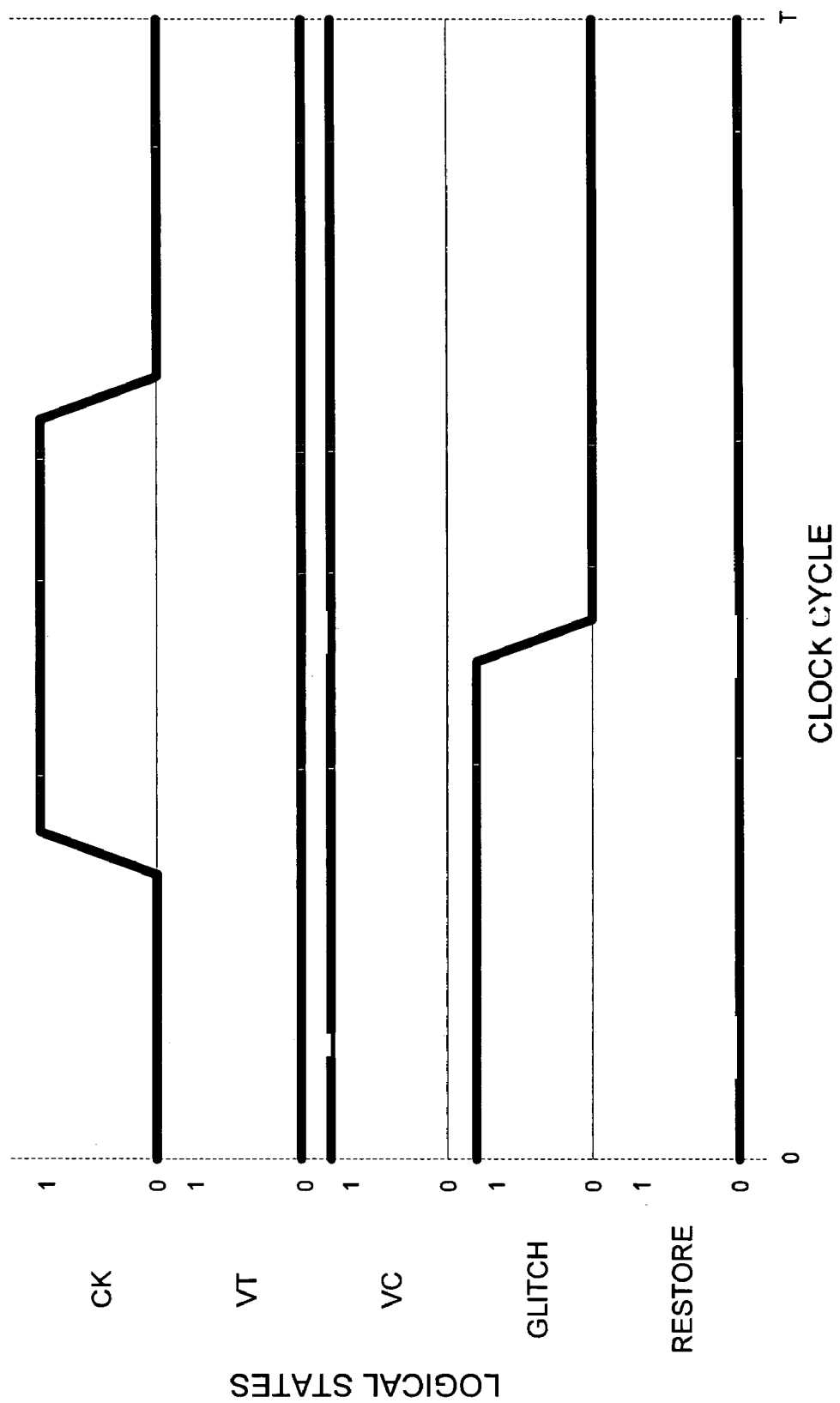
FIG. 7 is a timing diagram illustrating the logical states of the signals as they operate with the glitch protect valid cell of FIG. 4 in an invalidate condition.
Figure 8:
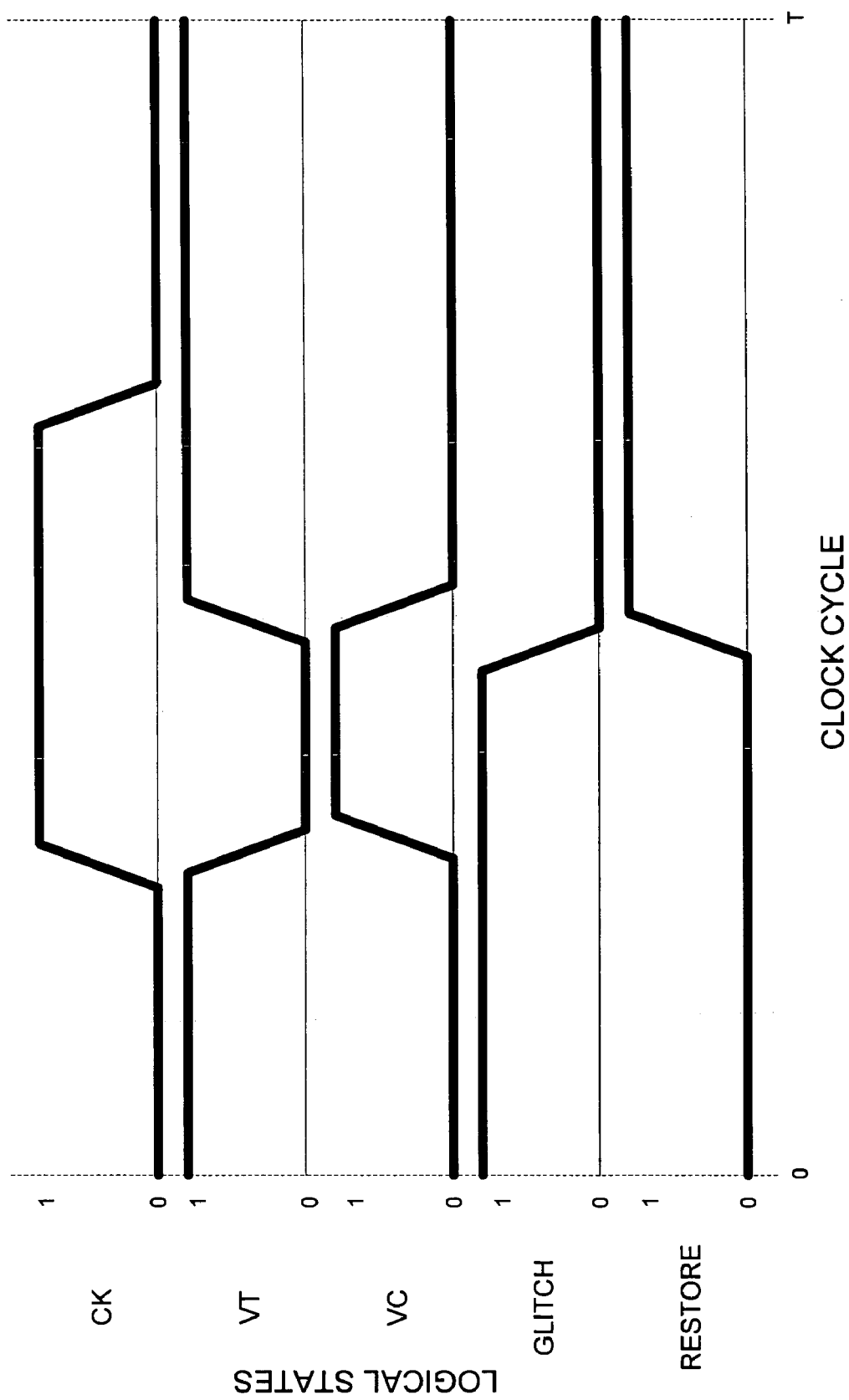
FIG. 8 is a timing diagram showing the logical states of the signals as they operate with the glitch protect valid cell of FIG. 4 in the glitch protect condition.

Instances on how glitch and timing signals affect the glitch protect valid cell 480 of FIG. 4 are shown in FIGS. 6-8. In particular, FIG. 6 is a flow chart featuring exemplary operations of the glitch protect valid cell 480 of FIG. 4 including a glitch protect condition and an invalidate condition. FIG. 7 illustrates a timing diagram showing the logical states of the signals as they operate with the glitch protect valid cell 480 of FIG. 4 in an invalidate condition. FIG. 8 is a timing diagram showing the logical states of the signals as they operate with the glitch protect valid cell 480 of FIG. 4 in a glitch protect condition.

Referring to FIG. 6, step 602 queries the logical value of the word line as coupled to the memory element 489 of FIG. 4. If the world line value is valued as "high" or a logical "1", then entry data is either read or written to the memory element 489 in step 604. Alternatively, step 602 advances to step 606 if the word line is valued as "low" or a logical "0".

Steps 606 and 608 of FIG. 6 characterize an invalidate condition of the glitch protect valid cell 480. In step 606, the logic value of the true valid bit is received by the memory element 489 from the bit lines 487, 497 and is stored therein. If the value of the true valid bit is invalid, logical "0", then an invalidate signal is associated with the logic value of the true valid bit in step 606. Accordingly, as provided by the cross-coupled networks of the memory element 489, the logic value of the complement of the true valid bit in step 608 is consequently a logical "1". For an invalidate condition, the previous logic value of the true valid bit, a logical "0", is thus stored in the state machine 485. Furthermore, in step 608, the state machine 485 yields a complement value of the previous true valid bit, a logical "1", at node α as shown in FIG. 4. The logical "1" value at node α is then provided as an input to the NOR gate 404.

Similarly, the logic value of the glitch signal is provided at a node 411 defined by the juncture of the logic line 481 and an input of the NOR gate 404. However, because the value of node α is a logical "1", the pull up network within the NOR gate 404 will not activate regardless of either a logical "0" or "1" value provided by the glitch signal at node 411. Consequently, the output from the NOR gate 404 is a restore signal having a value of logical "0" as clearly shown in FIG. 7.

The restore signal of logical "0" fails to ground the second pull down network 417 so as to reset the complement valid bit at the complement memory line 488 and, ultimately, set the true valid bit within the memory element 489. Accordingly, steps 606 and 608 of FIG. 6 characterize the invalidate condition whereby the restore signal is "0" and, thus, maintains an invalidate value for the true valid bit within the memory element 489 as step 608 loops back to step 602.

Alternatively, in FIG. 6, step 606 advances to step 610 where the logic value of the true valid bit is valid, i.e. logical "1". In step 610, the complement valid bit is assigned a logical "0" value by the memory element 489 prior to advancing toward steps 612 through 624.

Steps 612 through 624 of FIG. 6 characterize a glitch protect condition of the glitch protect valid cell 480. For steps 612 through 624, assume that the glitch protect valid cell 480 is subject to the state value of at least one glitch signal during a single clock cycle. It should be added that FIG. 8 is a timing diagram further characterizing the glitch protect valid cell 480 in a glitch protect condition during a single oscillating clock cycle, t.

In step 612, if the clock is "low", a logical "0", then the state machine interface 493 of FIG. 4 facilitates the transfer of the initial state value of the valid bit from the memory element 489 to establish a previous value of the valid bit as stored within the state machine 485. During a "low" clock period, the glitch protect valid cell 480 is not responsive to a glitch signal. Therefore, step 612 advances to step 614 for establishing logical values of a valid bit and its complement prior to looping back to step 602.

Alternatively, for a "high" clock in step 612, the first transistor 403 closes prior to advancing toward step 614 of FIG. 6. In step 616, the logic value at the node 411 is determined. If the glitch signal is on time, the node 411 features a logic value of "0". For a logical "0" value, the pull up network in the NOR gate 404 remains disabled so that the resulting restore value is "0" which fails to activate the reset gate 405 in second pull down network 417. Accordingly, for the on time glitch signal, step 616 ensures that the glitch signal has not interfered with the "valid" state of the true valid bit and thus returns to step 602.

On the other hand, a delayed glitch signal is characterized by a logic value of "1" at the node 411 which consequently closes the second transistor 408 to ground. For a "high" clock at the first transistor 403, the initial logic value of the true valid bit is reset and as shown in step 618 and in FIG. 8.

Step 620 determines the logic state value of node α, which is the complement value of the previous state of the true valid bit from the memory element 489 as stored within the state machine 485. In step 620, if node α equals "0" and the state value at the node 411 has also become "0" upon the arrival of the delayed glitch signal, then the pull up network in the NOR gate 404 is enabled. Accordingly, in step 622, the NOR gate 404 provides a restore signal having a logic value of "1". As a result, the reset gate 405 in FIG. 4 closes; and if the time select gate 409 at clock "high" remains closed, the value of the complement of the true valid bit is grounded along the complement memory line 488. Therefore, in step 624, the initial logic state value of the true valid bit in the memory element 489 is restored prior to looping back to step 602. The restoration of the initial logic state value is further illustrated in FIG. 8 for the logical states of true valid, Vt, complement valid, Vc, and restore signals as the clock cycle advances toward the end of one clock cycle, t.

Although the present invention has been described in detail, it should be understood that various changes, substitutions, and alterations could be made hereto without departing from the spirit and scope of the invention as defined by the appended claims.

We claim:

1. A glitch protect valid cell for maintaining a desired logic state value in response to a glitch signal and a timing signal, the glitch protect valid cell is electrically coupled to a content addressable memory (CAM) array, differential bit lines for providing a true valid bit and its complement, a logic element for providing the glitch signal, and a clockline for providing the timing signal, the glitch protect valid cell comprising:

a memory element, the memory element is electrically coupled to the bit lines and stores an initial state value of the true valid bit and the complement valid bit;

a state machine, the state machine is responsive to the memory element and stores the previous logic state value of the true valid bit from the memory element; and a glitch protect circuit electrically coupled to the memory element and the state machine, the glitch protect circuit including a propagation delay assembly and a restore assembly electrically coupled to the propagation delay assembly, the propagation delay assembly includes a glitch and timing signal dependent logic gate and a first pull down network electrically coupled to the glitch and timing signal dependent logic gate and the memory element, the first pull down network is responsive to the glitch signal and the timing signal to selectively engage the glitch and timing signal dependent logic gate, particularly, in a glitch protect condition, the first pull down network resets the initial state value of the true valid bit according to the timing signal and the glitch signal, the state machine and the first pull down network respectively provide to the glitch and timing signal dependent logic gate a previous state value and the reset value, the restore assembly includes a second pull down network electrically coupled to the propagation delay assembly and the memory element, in the glitch protect condition, the second pull down network is responsive to a pull up network selectively enabled within the glitch and timing signal dependent logic gate and resets the complement valid bit in the memory element, via the timing signal and a restore signal provided by the glitch and timing signal dependent logic gate indicating the enabled pull up network, thereby restoring the initial state value of the true valid bit.

2. The glitch protect valid cell according to claim 1 wherein the previous state value provided by the state machine to the glitch and timing signal dependent logic gate comprises the complement value of the previous logic state value of the true valid bit from the memory element.

3. The glitch protect valid cell according to claim 1 wherein the glitch and timing signal dependent logic gate comprises a NOR gate.

4. The glitch protect valid cell according to claim 1 the glitch protect valid cell according to claim 1 further comprising a state machine interface, the state machine interface receives a timing signal and is electrically coupled to the memory element and the state machine, and wherein the state machine interface facilitates transfer of the state value from the memory element to the state machine based on the timing signal.

5. The glitch protect valid cell according to claim 4 further comprising a clock interface assembly, the clock interface assembly is electrically coupled to the state machine interface, the state machine, the glitch protect circuit, and the clockline for receiving a timing signal, and wherein the clock interface assembly renders a plurality of timing signals for the state machine interface, the state machine, and the glitch protect circuit.

6. The glitch protect valid cell according to claim 1 wherein, in an invalidate condition, the glitch protect circuit maintains the initial state invalidate value of the true valid bit within the memory element.

7. The glitch protect valid cell according to claim 6 wherein the initial state invalidate value is set within the state machine prior to transmission to the glitch and timing signal dependent logic gate, the set initial invalidate value disables the pull up network within the glitch and timing signal dependent logic gate as the glitch and timing signal dependent logic gate provides a restore signal for preventing the second pull down network from resetting the complement valid bit in the memory element.

8. The glitch protect valid cell according to claim 7 wherein the initial state invalidate value of the true valid bit stored in the glitch protect valid cell restricts access to data associated with the CAM array coupled to glitch protect valid cell.

9. A memory system for maintaining a desired logic state value in response to a glitch signal provided by a logic element and a timing signal provided by a clockline, the memory system electrically coupled to differential bit lines for receiving a true valid bit and its complement therefrom, the memory system comprising:

a glitch protect valid cell;

a memory block array responsive to the glitch protect valid cell, the memory block array including a plurality of integrated memory cells for storing data; and wherein the glitch protect valid cell includes
a memory element, the memory element is electrically coupled to the bit lines and stores an initial logic state value of the true valid bit and the complement valid bit,
a state machine, the state machine is responsive to the memory element, and
a glitch protect circuit electrically coupled to the memory element and the state machine,
the glitch protect circuit including a propagation delay assembly and a restore assembly electrically coupled to the propagation delay assembly and the memory element,
the propagation delay assembly includes
a first pull down network and a glitch and timing signal dependent logic gate electrically coupled to the first pull down network,
the first pull down network is responsive to the glitch signal and the timing signal to selectively engage the glitch and timing signal dependent logic gate, particularly, in a glitch protect condition, the first pull down network resets the initial state value of the true valid bit according to the timing signal and the glitch signal, the state machine and the first pull down network respectively provide to the glitch and timing signal dependent logic gate a previous logic state value of the memory element stored in the state machine and the reset value,
the restore assembly includes a second pull down network electrically coupled to the propagation delay assembly,
in the glitch protect condition, the second pull down network is responsive to the pull up network selectively enabled within the glitch and timing signal dependent logic gate and resets the complement valid bit in the memory element, via the timing signal and a restore signal provided by the enabled glitch and timing signal dependent logic gate, thereby restoring the initial state value of the true valid bit.

10. The memory system according to claim 9 wherein the memory block array comprises a sum-addressed content addressable memory (CAM) array, and wherein the CAM array includes a plurality of CAM cells for storing data.

11. The memory system according to claim 9 wherein, in an invalidate condition, the glitch protect circuit maintains the initial state invalidate value of the true valid bit within the memory element.

12. A computer-implemented method for maintaining a desired logic state value in response to a glitch signal and a timing signal comprising the steps of:
coupling a content addressable memory (CAM) array as responsive to a glitch protect valid cell, the glitch protect valid cell including a memory element, a state machine, and a glitch protect circuit electrically coupled to one another;
receiving a true valid bit from bit lines via the memory element and storing an initial state value of the true valid bit and the complement valid bit in the memory element;
storing a previous state value of the true valid bit from the memory element via the state machine;
resetting the initial state value of the true valid bit with the glitch protect circuit according to both the glitch signal and the timing signal supplied to the glitch protect circuit in a glitch protect condition, the glitch protect circuit including a glitch and timing signal dependent logic gate; and
restoring the initial state value of the true valid bit with the glitch protect circuit via the timing signal and a restore signal provided by the glitch and timing signal dependent logic gate indicating an enabled pull up network within the glitch and timing signal dependent logic gate.

13. The method according to claim 12 wherein the step of resetting the initial state value of the true valid bit includes the step of resetting the initial value of the true valid bit with the glitch and timing signal dependent logic gate and a first pull down network electrically coupled to the glitch and timing signal dependent logic gate, each provided by the glitch protect circuit.

14. The method according to claim 12 wherein the step of restoring the initial state value of the true valid bit includes the step of generating a restore signal with the glitch and timing signal dependent logic gate indicating a selectively enabled pull up network within the glitch and timing signal dependent logic gate.

15. The method according to claim 14 wherein the step generating a restore signal includes the step of providing the complement value of the previous logical state value of the true valid bit and a logical low value to the glitch and timing signal dependent logic gate with the state machine and the first pull down network respectively.

16. The method according to claim 12 wherein the step of restoring the initial state value of the true valid bit includes the step of resetting the complement valid bit in the memory element by applying the restore signal to a second pull down network provided by the glitch protect circuit, the second pull down network electrically coupled to the first pull down network and the glitch and timing signal dependent logic gate.

17. The method according to claim 12 further comprising the steps of maintaining the initial state invalidate value of the true valid bit with the glitch protect circuit in an invalidate condition.

18. The method according to claim 17 wherein the step of maintaining the initial state invalidate value includes the steps of
setting the initial state invalidate value prior to transmission to the glitch and timing signal dependent logic gate;
disabling the pull up network within the glitch and timing signal dependent logic gate via the set initial state invalidate value; and
generating, via the glitch and timing signal dependent logic gate, a restore signal for preventing the second pull down network from resetting the complement valid bit in the memory element.

19. The method according to claim 17 wherein the step of maintaining the initial state invalidate value includes the step of restricting access to data associated with the CAM array via initial state invalidate value of the true valid bit stored in the glitch protect valid cell electrically coupled to the CAM array.

20. The method according to claim 12 further comprising the step of applying a plurality of glitch signals to the glitch protect valid cell in one clock cycle.

* * * * *